(12) United States Patent
Horng et al.

(10) Patent No.: US 7,777,376 B2
(45) Date of Patent: Aug. 17, 2010

(54) DRIVING CIRCUIT BOARD ASSEMBLY FOR MOTOR

(75) Inventors: Alex Horng, Kaohsiung (TW); Ching-Shen Hong, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 323 days.

(21) Appl. No.: 12/016,387

(22) Filed: Jan. 18, 2008

(65) Prior Publication Data
US 2009/0153001 A1    Jun. 18, 2009

(30) Foreign Application Priority Data
Dec. 18, 2007    (TW) .............................. 96148440 A

(51) Int. Cl.
*H02K 11/00*    (2006.01)
(52) U.S. Cl. ...................................... 310/71; 310/68 R
(58) Field of Classification Search .................. 310/71, 310/68 R, 67 R
See application file for complete search history.

(56) References Cited

U.S. PATENT DOCUMENTS

| 5,017,818 | A | * | 5/1991 | Dohogne ..................... 310/71 |
| 5,510,664 | A | | 4/1996 | Suzuki et al. |
| 5,606,208 | A | | 2/1997 | Sakashita et al. |
| 5,895,994 | A | * | 4/1999 | Molnar et al. ................ 310/215 |
| 6,661,134 | B2 | * | 12/2003 | Sunaga et al. .................. 310/64 |
| 6,815,851 | B2 | * | 11/2004 | Nishikata et al. ........... 310/67 R |
| 7,105,963 | B2 | * | 9/2006 | Ito et al. ........................ 310/71 |
| 7,187,518 | B2 | * | 3/2007 | Hong et al. .............. 360/99.08 |
| 7,268,452 | B2 | * | 9/2007 | Yoshino et al. ................ 310/71 |

* cited by examiner

*Primary Examiner*—Thanh Lam
(74) *Attorney, Agent, or Firm*—Alan Kamrath; Kamrath & Associates PA

(57) ABSTRACT

A driving circuit board assembly for a motor includes a plurality of driving circuit boards having a plurality of faces for mounting a plurality of electronic elements thereon. The driving circuit boards are stacked in an axial direction of a motor. Two of the driving circuit boards adjacent to each other are spaced by a conductive connecting member that is in electrical connection with the two driving circuits.

18 Claims, 7 Drawing Sheets

US 7,777,376 B2

DRIVING CIRCUIT BOARD ASSEMBLY FOR MOTOR

BACKGROUND OF THE INVENTION

1. Field of the Invention

The present invention relates to a driving circuit board assembly for a motor and, more particularly, to a driving circuit board assembly including a plurality of axially spaced driving circuit boards.

2. Description of Related Art

FIG. 1 of the drawings illustrates a conventional motor 9 including a driving circuit board 91, a stator 92, and a rotor 93. The driving circuit board 91 includes a plurality of electronic elements 8 such as power electronics switches, resistors, capacitors, Hall ICs, pulse-width-modulation ICs, etc. The driving circuit board 91 is electrically connected to the stator 92 to feed the stator 92 with a driving current for creating a magnetic field to drive the rotor 93.

However, when the motor 9 has a high output power rated, with the electronic elements 8 densely arranged on one side of the driving circuit board 91 and the other side of the driving circuit board 91 being close to the stator 92, the increase of the driving current of the driving circuit board 91 causes a lot of heat, which is generated by the electronic elements 8 on the driving circuit board 91, and results in poor heat dissipation. The lives of the electronic elements 8 are thus shortened. Furthermore, additional electronic elements including temperature sensors, speed detectors, multiplexers, analog/digital converters, microprocessors, etc are incorporated into a motor to provide additional functions including temperature detection, speed detection, etc. Difficulties arise when incorporating these additional electronic elements onto the driving circuit board 91 that is crowded with the electronic elements 8, leading to inconvenience to assembly and aggravation of the heat dissipating problems.

SUMMARY OF THE INVENTION

An objective of the present invention is to provide a driving circuit board assembly for a motor that provides a larger area for mounting electronic elements and that provides enhanced heat-dissipating effect.

A driving circuit board assembly for a motor according to the preferred teachings of the present invention includes a plurality of driving circuit boards having a plurality of faces each adapted for mounting a plurality of electronic elements thereon. The driving circuit boards are stacked in an axial direction of a motor. Two of the driving circuit boards adjacent to each other are spaced by a conductive connecting member that is in electrical connection between driving circuits respectively arranged on the two driving circuit boards.

In a preferred form, the driving circuit boards and the conductive connecting member are integral with each other as a single continuous monolithic piece made of a flexible material.

Other objects, advantages and novel features of this invention will become more apparent from the following detailed description when taken in conjunction with the accompanying drawings.

DETAILED DESCRIPTION OF THE PREFERRED EMBODIMENTS

Figure 1:
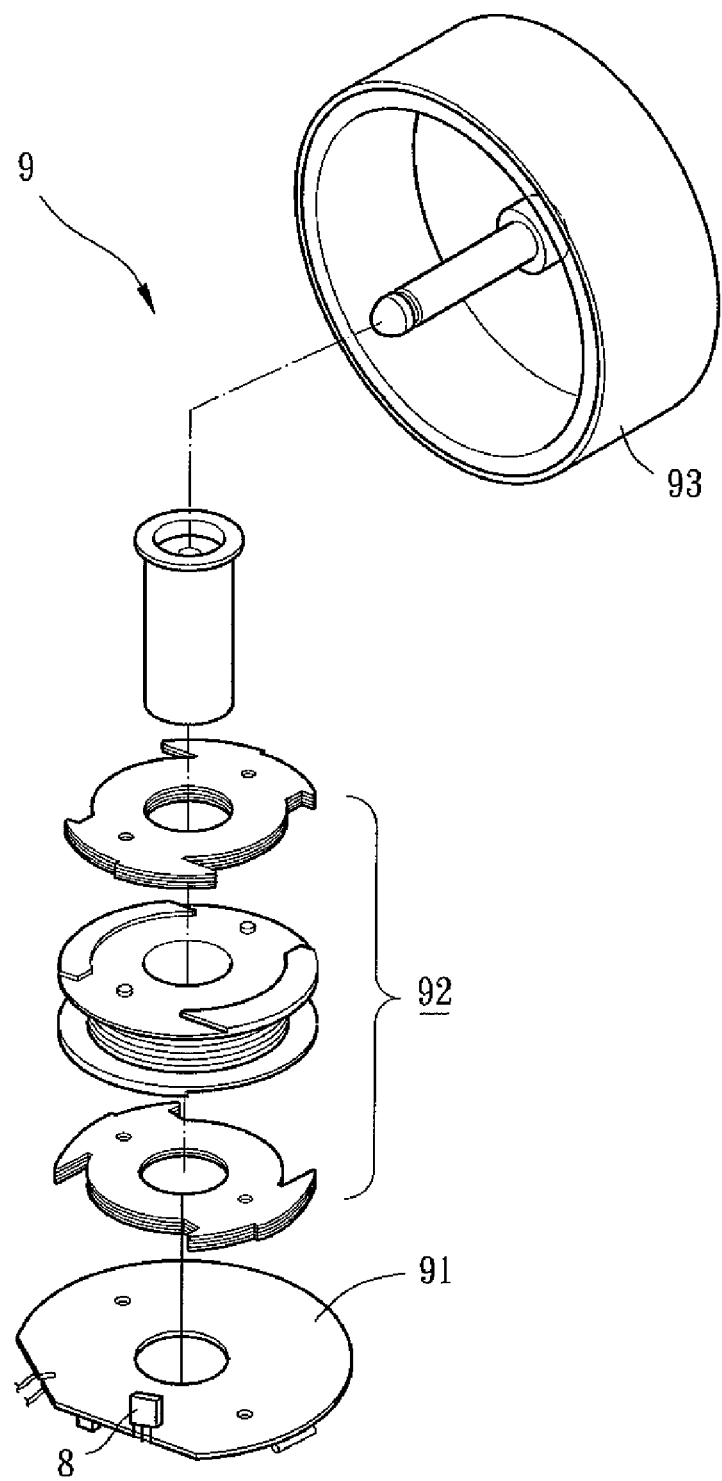
FIG. 1 shows an exploded perspective view of a motor utilizing a conventional driving circuit board.
Figure 2:
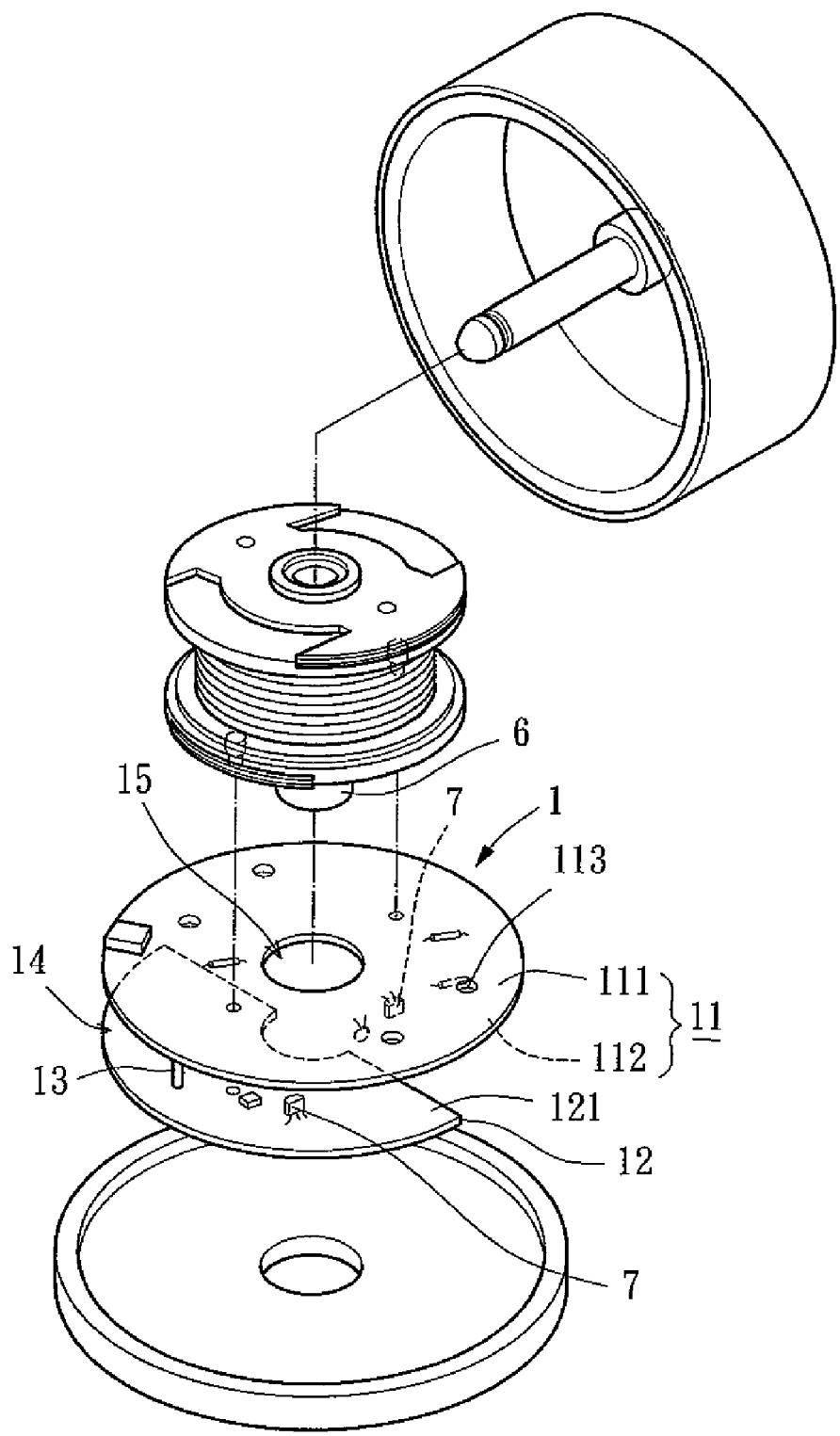
FIG. 2 shows an exploded perspective view of a motor utilizing a driving circuit board assembly of a first embodiment according to the preferred teachings of the present invention.
Figure 3:
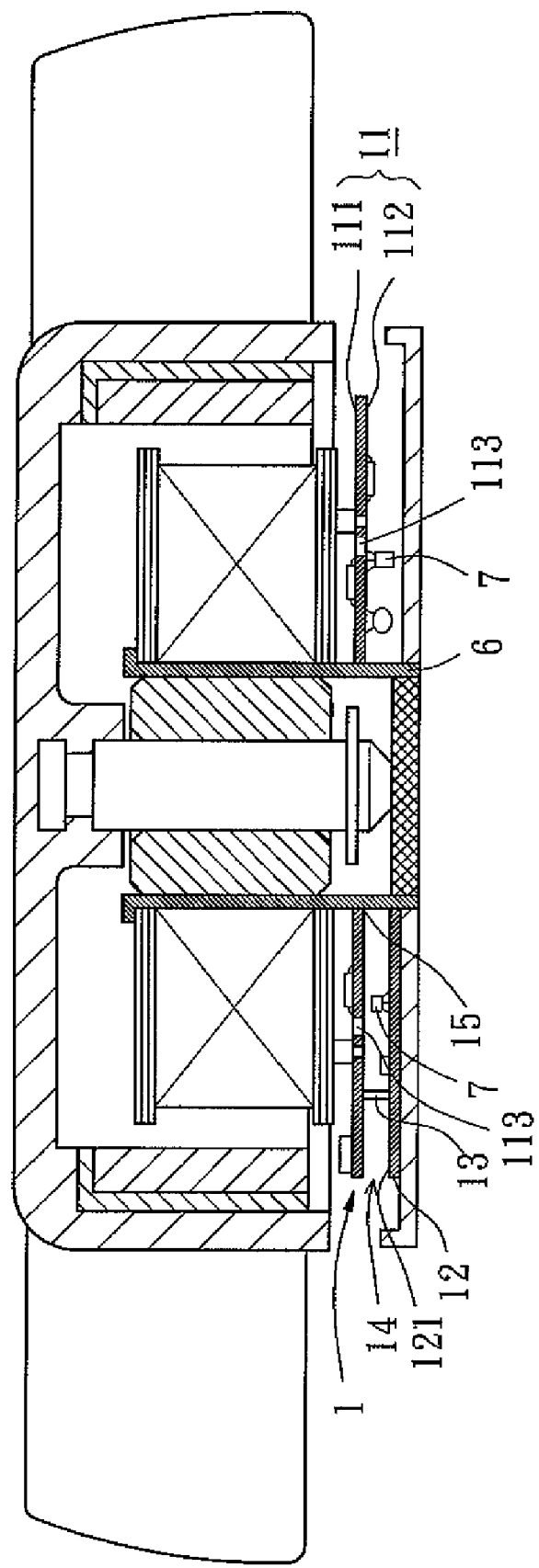
FIG. 3 shows a cross-sectional view of the motor of FIG. 2.

Referring to FIGS. 2 and 3, a driving circuit board assembly 1 for a motor of a first embodiment according to the preferred teachings of the present invention includes first and second driving circuit boards 11 and 12 stacked and spaced in an axial direction of a motor. According to the preferred form shown, a conductive connecting member 13, for example in the form of a conductive rod, is mounted between the first and second driving circuit boards 11 and 12 to provide a spacing 14 between the first and second driving circuit boards 11 and 12. The first driving circuit 11 includes opposite first and second faces 111 and 112 on which a plurality of electronic elements 7 are mounted. The first driving circuit board 11 further includes a mounting hole 15 extending from the first face 111 through the second face 112. The mounting hole 15 is preferably in a center of the first driving circuit board 11 and allows the first driving circuit board 11 to be mounted around an axle tube 6 (FIG. 3) of the motor. A stator and a rotor can be coupled with the axle tube 6. A plurality of blades can be formed on the rotor. The first driving circuit board 11 further includes at least one vent 113 extending from the first face 111 through the second face 112. The second driving circuit board 12 includes a face 121 on which a plurality of electronic elements 7 are mounted. The other face of the second driving circuit board 12 is coupled with a base of the motor. The conductive connecting member 13 provides electrical connection for the electronic elements 7 on the first driving circuit board 11 and the electronic elements 7 on the second driving circuit board 12.

Since electronic elements 7 can be mounted on three faces 111, 112, and 113, dissipation of the heat generated by the electronic elements 7 will not be a problem, plus the vents 113 guide the heat in the spacing 14 outside the driving circuit board assembly 1. Thus, the overall heat-dissipating effect is enhanced even though electronic elements 7 such as electric power switches generating considerable heat are utilized.

Figure 4:
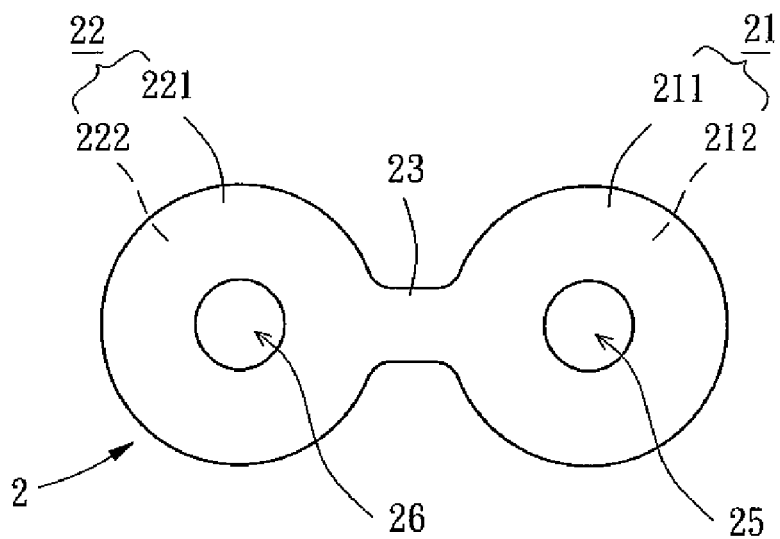
FIG. 4 shows a top view of a driving circuit board assembly of a second embodiment according to the preferred teachings of the present invention with the driving circuit board assembly in a flattened state.
Figure 5:
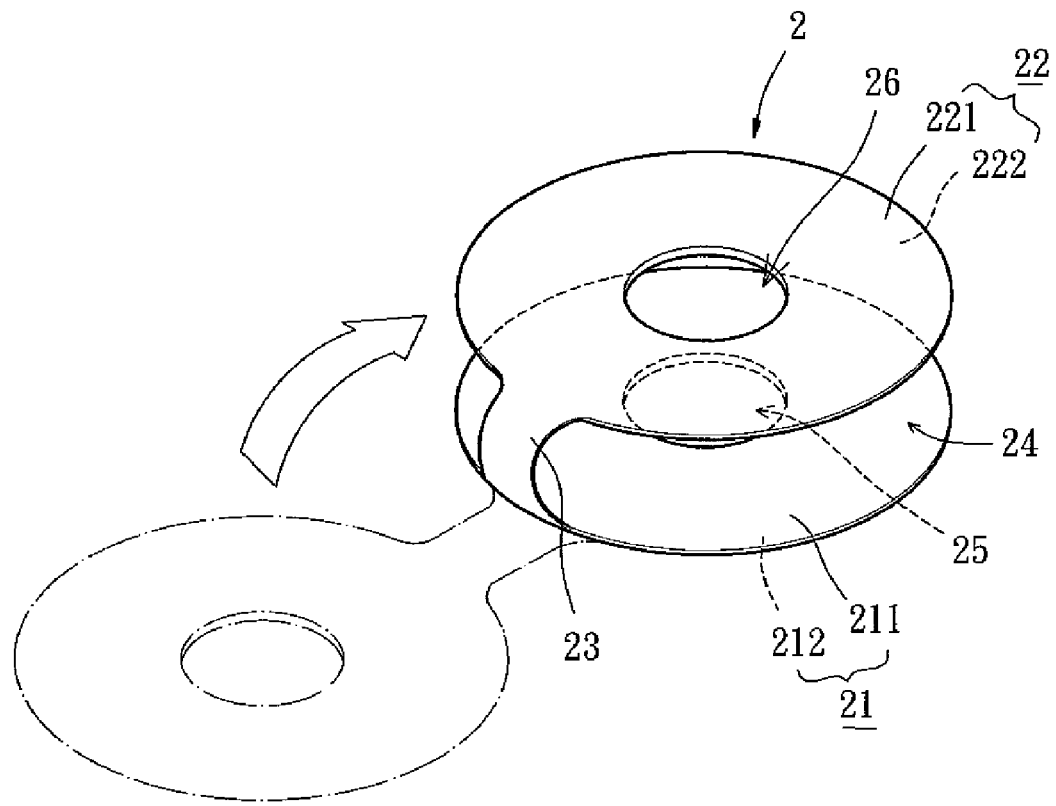
FIG. 5 shows a perspective view of the driving circuit board assembly of FIG. 4 after bending.

FIGS. 4 and 5 show a driving circuit board assembly 2 for a motor of a second embodiment according to the preferred teachings of the present invention. According to the preferred form shown, the driving circuit board assembly 2 includes first and second driving circuit boards 21 and 22 and a conductive connecting member 23 interconnected between the first and second driving circuit boards 21 and 22. According to the most preferred form shown, the first and second driving circuit boards 21 and 22 and the conductive connecting member 23 are integral with each other as a single continuous monolithic piece and made of a flexible material such as fiberglass. The conductive connecting member 23 extends from an outer periphery of the first driving circuit board 21 to an outer periphery of the second driving circuit board 22. The first driving circuit board 21 includes opposite first and second faces 211 and 212 on which a plurality of electronic elements 7 are mounted. The first driving circuit board 21 further includes a first mounting hole 25 extending from the first face 211 through the second face 212. The second driving circuit board 22 includes opposite third and fourth faces 221 and 222 on which a plurality of electronic elements 7 are mounted. The second driving circuit board 22 further includes a second mounting hole 26 extending through the third face 221 through the fourth face 222. It is noted that the electronic elements 7 on the first driving circuit board 21 are in electrical connection with the electronic elements 7 on the second driving circuit board 22 via the conductive connecting member 23.

Figure 6:
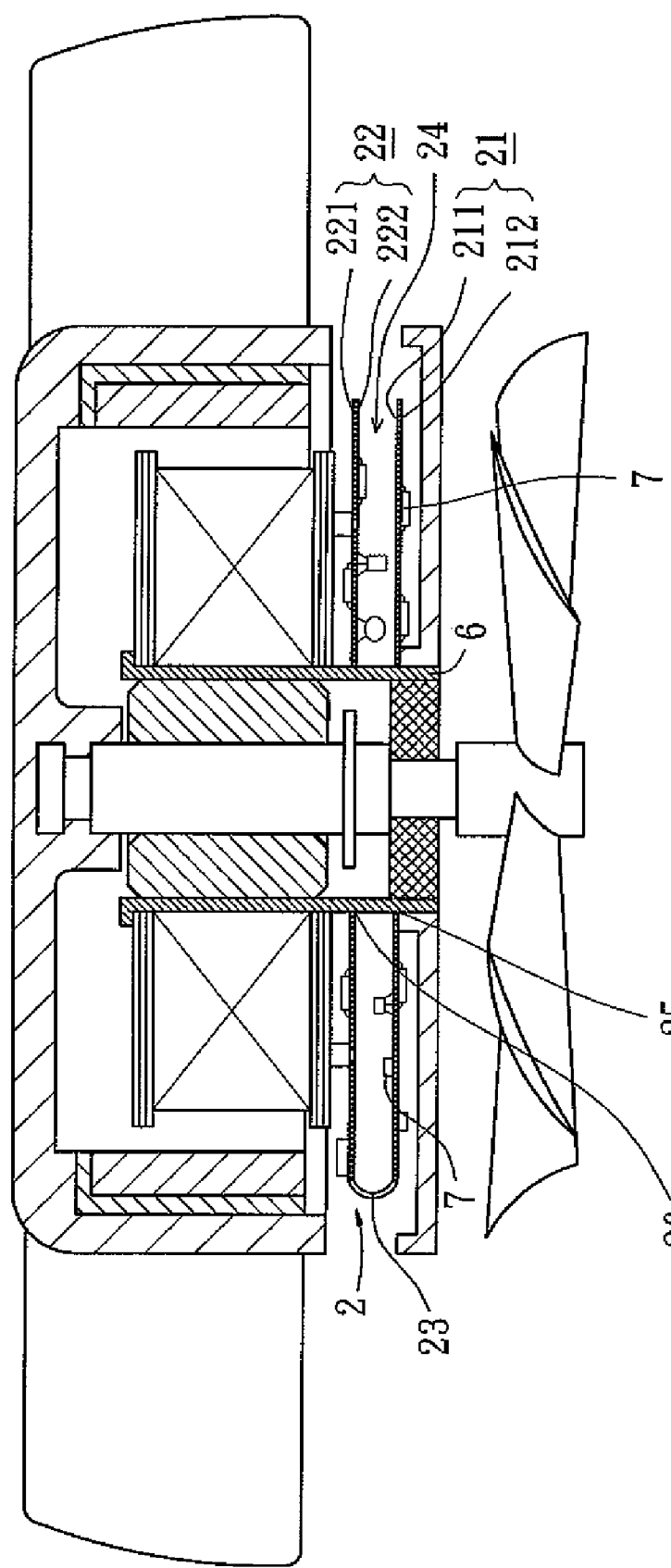
FIG. 6 shows a cross-sectional view of a motor utilizing the driving circuit board assembly of FIG. 5.

In assembly, the first and second mounting holes 25 and 26 of the first and second driving circuit boards 21 and 22 are aligned with each other by bending the flexible conductive connecting member 23, with a spacing 24 formed between the first and second driving circuit boards 21 and 22. The first and second mounting holes 25 and 26 allow the first and second driving circuit boards 21 and 22 to be mounted around an axle tube 6 (FIG. 6) of a motor, with the first and second driving circuit boards 21 and 22 stacked and spaced in an axial direction of the motor. An end of the axle tube 6 extends beyond the first face 211 of the first driving circuit board 21 for coupling with a stator and a rotor. A plurality of blades can be formed on the rotor. Since electronic elements 7 with larger driving capacity and more controlling electronic elements 7 can be mounted on the driving circuit board assembly 2, the motor utilizing the driving circuit board assembly 2 has high output power rated. It can be appreciated that an impeller (FIG. 6) can be mounted to the other end of the axle tube 6 that extends beyond the second driving circuit board 22.

Figure 7:
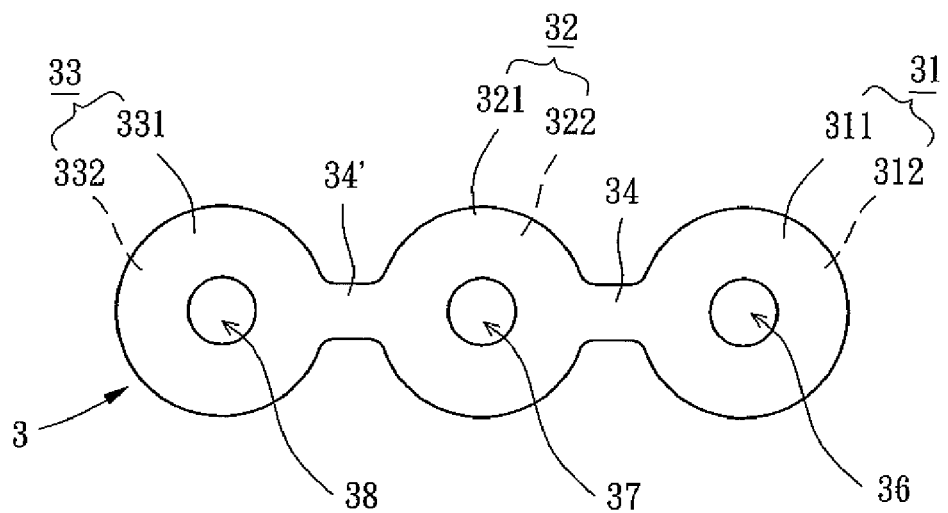
FIG. 7 shows a top view of a driving circuit board assembly of a third embodiment according to the preferred teachings of the present invention with the driving circuit board assembly in a flattened state.
Figure 8:
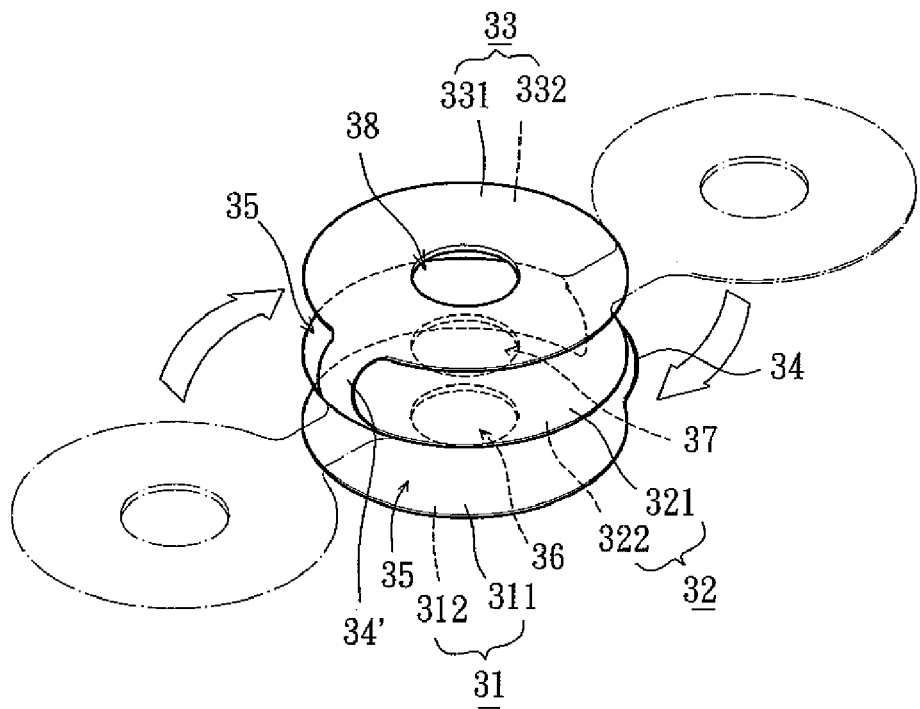
FIG. 8 shows a perspective view of the driving circuit board assembly of FIG. 7 after bending.

FIGS. 7 and 8 show a driving circuit board assembly 3 for a motor of a third embodiment according to the preferred teachings of the present invention. According to the preferred form shown, the driving circuit board assembly 3 includes first, second, and third driving circuit boards 31, 32, and 33, a first conductive connecting member 34 interconnected between the first and second driving circuit boards 31 and 32, and a second conductive connecting member 34' interconnected between the second and third driving circuit boards 32 and 33. According to the most preferred form shown, the first, second, and third driving circuit boards 31, 32, 33 and the first and second conductive connecting member 34, 34' are integral with each other as a single continuous monolithic piece and made of a flexible material such as fiberglass. The first conductive connecting member 34 extends from an outer periphery of the first driving circuit board 31 to an outer periphery of the second driving circuit board 32. Preferably, the first conductive connecting member 34 is diametrically opposite to the second conductive connecting member 34', with the conductive connecting members 34, 34' respectively extending in opposite radial directions from an outer periphery of the second driving circuit board 32 to outer peripheries of the first and third driving circuit boards 31, 33.

The first driving circuit board 31 includes opposite first and second faces 311 and 312 on which a plurality of electronic elements 7 are mounted. The first driving circuit board 31 further includes a first mounting hole 36 extending from the first face 311 through the second face 312. The second driving circuit board 32 includes opposite third and fourth faces 321 and 322 on which a plurality of electronic elements 7 are mounted. The second driving circuit board 32 further includes a second mounting hole 37 extending through the third face 321 through the fourth face 322. It is noted that the electronic elements 7 on the first driving circuit board 31 are in electrical connection with the electronic elements 7 on the second driving circuit board 32 via the first conductive connecting member 34. The third driving circuit board 33 includes opposite fifth and sixth faces 331 and 332 on which a plurality of electronic elements 7 are mounted. The third driving circuit board 33 further includes a third mounting hole 38 extending through the fifth face 331 through the sixth face 332. It is noted that the electronic elements 7 on the second driving circuit board 32 are in electrical connection with the electronic elements 7 on the third driving circuit board 33 via the second conductive connecting member 34'.

Figure 9:
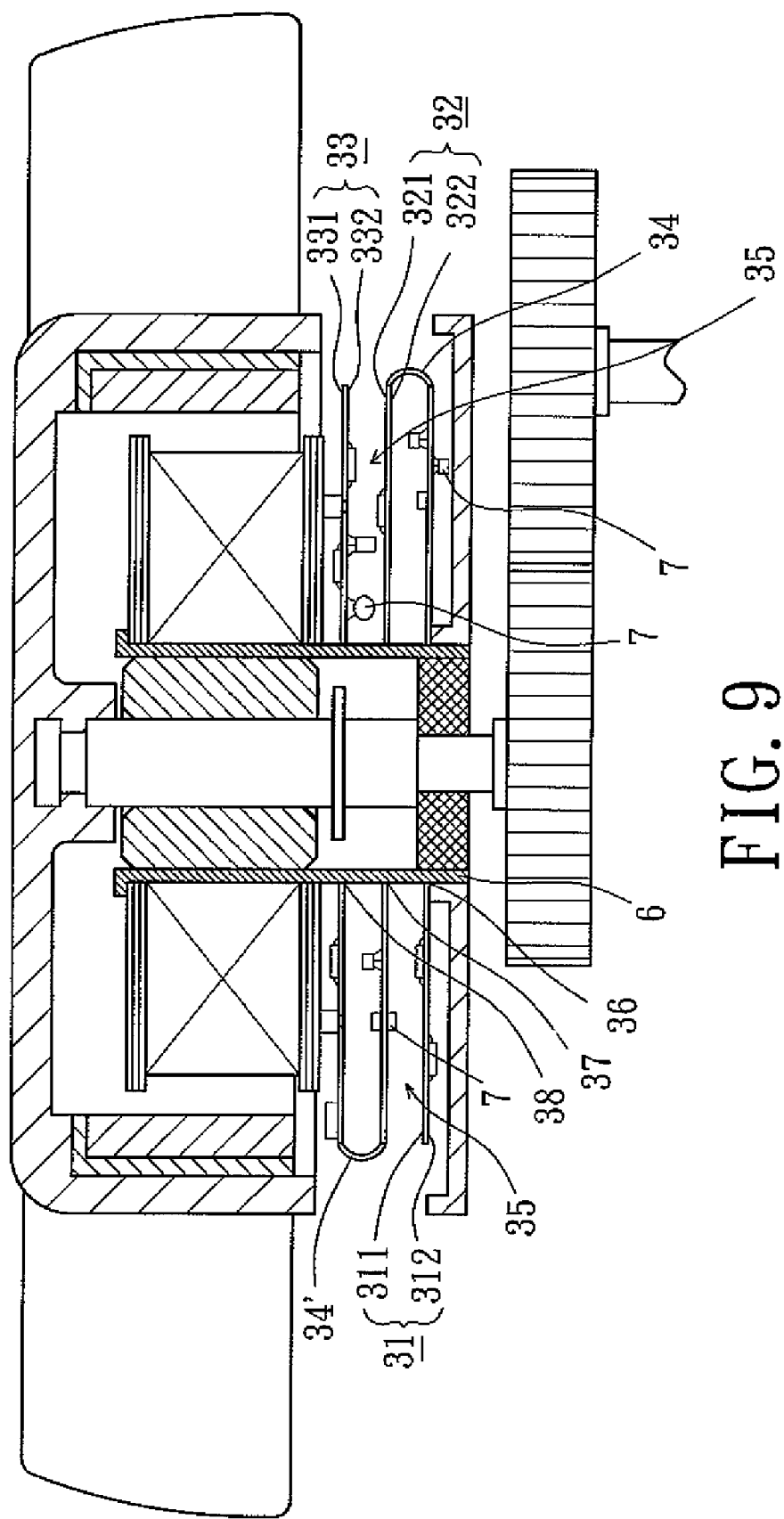
FIG. 9 shows a cross-sectional view of a motor utilizing the driving circuit board assembly of FIG. 8.

In assembly, the first, second, and third mounting holes 36, 37, and 38 of the first, second, and third driving circuit boards 31, 32, and 33 are aligned with each other by bending the flexible first and second conductive connecting members 34 and 34', with a spacing 35 formed between the first and second driving circuit boards 31 and 32, and with another spacing 35 formed between the second and third driving circuit boards 32 and 33. The first, second, and third mounting holes 36, 37, and 38 allow the first, second, and third driving circuit boards 31, 32, and 33 to be mounted around an axle tube 6 (FIG. 9) of a motor, with the first, second, and third driving circuit boards 31, 32, and 33 stacked and spaced in an axial direction of the motor. An end of the axle tube 6 extends beyond the first face 311 of the first driving circuit board 31 for coupling with a stator and a rotor. A plurality of blades can be mounted on the rotor.

Since the driving circuit board assembly 2 provides six faces 311, 312, 321, 322, 331, and 332 for mounting electronic elements 7, the motor utilizing the driving circuit board assembly 3 has high output power rated. It can be appreciated that a gear (FIG. 9) can be mounted to the other end of the axle tube 6 that extends beyond the third driving circuit board 33 for connection with another gear of a gear train or the like.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A driving circuit board assembly for motor comprising:
   a first driving circuit board including opposite first and second faces;
   a second driving circuit board including a third face facing one of the first and second faces, with the first and second driving circuit board being stacked in an axial direction of a motor, with the second driving circuit board being spaced from the first driving circuit board; and
   a conductive connecting member in electrical connection with the first and second driving circuit boards, with the first and second driving circuit boards being spaced by the conductive connecting member;
   wherein a plurality of electronic elements is mounted on the first, second, and third faces.

2. The driving circuit board assembly as claimed in claim 1, with the first driving circuit board further including at least one vent extending from the first face through the second face.

3. The driving circuit board assembly as claimed in claim 1, with the second driving circuit board further including a fourth face opposite to the third face, and with the fourth face also being adapted for mounting a plurality of electronic elements thereon.

4. The driving circuit board assembly as claimed in claim 1, with the first driving circuit board further including a first mounting hole extending from the first face through the second face.

5. The driving circuit board assembly as claimed in claim 4, with the second driving circuit board further including a second mounting hole extending through the second driving circuit board, with the second mounting hole being aligned with and spaced from the first mounting hole in the axial direction of the motor.

6. The driving circuit board assembly as claimed in claim 1, with the first and second driving circuit boards and the conductive connecting member being integral with each other as a single continuous monolithic piece.

7. The driving circuit board assembly as claimed in claim 6, with the single continuous monolithic piece being made of a flexible material.

8. The driving circuit board assembly as claimed in claim 7, with the conductive connecting member being bent and extending from an outer periphery of the first driving circuit board to an outer periphery of the second driving circuit board.

9. The driving circuit board assembly as claimed in claim 1, further comprising a third driving circuit board including two opposite faces for mounting a plurality of electronic elements thereon.

10. The driving circuit board assembly as claimed in claim 9, further comprising a second conductive connecting member interconnected between the second and third driving circuit boards and providing electrical connection between the second and third driving circuit boards.

11. The driving circuit board assembly as claimed in claim 10, with the second and third driving circuit boards being spaced by the second conductive connecting member.

12. The driving circuit board assembly as claimed in claim 10, with the first driving circuit board further including a first mounting hole extending from the first face through the second face, with the second driving circuit board further including a second mounting hole extending through the second driving circuit board, with the second mounting hole being aligned with and spaced from the first mounting hole in the axial direction of the motor, with the third driving circuit board further including a third mounting hole extending through the third driving circuit board, and with the third mounting hole being aligned with and spaced from the second mounting hole in the axial direction of the motor.

13. A driving circuit board assembly for a motor comprising:
a plurality of driving circuit boards including a plurality of faces each adapted for mounting a plurality of electronic elements thereon, with said plurality of driving circuit boards being stacked in an axial direction of a motor, with two of said plurality of driving circuit boards adjacent to each other having a spacing therebetween; and
at least one conductive connecting member in electrical connection with two of said plurality of driving circuit boards adjacent to each other, with the two of said plurality of driving circuit boards adjacent to each other being spaced by said at least one conductive connecting member.

14. The driving circuit board assembly as claimed in claim 13, with said a plurality of driving circuit boards further including at least one vent.

15. The driving circuit board assembly as claimed in claim 13, with said plurality of driving circuit boards further including a plurality of mounting holes extending therethrough, with the plurality of mounting holes being aligned in the axial direction of the motor.

16. The driving circuit board assembly as claimed in claim 13, with said plurality of driving circuit boards and said at least one conductive connecting member being integral with each other as a single continuous monolithic piece.

17. The driving circuit board assembly as claimed in claim 16, with the single continuous monolithic piece being made of a flexible material.

18. The driving circuit board assembly as claimed in claim 13, with each said at least one conductive connecting member being bent and extending from an outer periphery of one of the two of said plurality of driving circuit boards adjacent to each other to an outer periphery of another of the two of said plurality of driving circuit boards adjacent to each other.

* * * * *